(12) United States Patent
Tailor et al.

(10) Patent No.: US 11,456,364 B2
(45) Date of Patent: Sep. 27, 2022

(54) STRUCTURE AND METHOD TO PROVIDE CONDUCTIVE FIELD PLATE OVER GATE STRUCTURE

(71) Applicant: GLOBALFOUNDRIES U.S. Inc., Santa Clara, CA (US)

(72) Inventors: Ketankumar H. Tailor, Dresden (DE); Peter Baars, Dresden (DE); Ruchil K. Jain, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/029,446

(22) Filed: Sep. 23, 2020

(65) Prior Publication Data
US 2022/0093751 A1    Mar. 24, 2022

(51) Int. Cl.
*H01L 29/40* (2006.01)
*H01L 29/49* (2006.01)
(Continued)

(52) U.S. Cl.
CPC ........ *H01L 29/402* (2013.01); *H01L 29/0653* (2013.01); *H01L 29/401* (2013.01); *H01L 29/4975* (2013.01); *H01L 29/7845* (2013.01)

(58) Field of Classification Search
CPC ............... H01L 29/0653; H01L 29/401; H01L 29/4975; H01L 29/7845; H01L 29/402–407; H01L 29/665–66507; H01L 21/823418; H01L 21/823814; H01L 29/66681–66704; H01L 29/7816–7826; H01L 29/66568–66659
See application file for complete search history.

(56) References Cited

U.S. PATENT DOCUMENTS 7,405,443 B1   7/2008   Zuniga et al.
8,541,848 B2   9/2013   Huang et al.
(Continued)

FOREIGN PATENT DOCUMENTS

CN          111092123 A  *  5/2020   ........... H01L 29/401

OTHER PUBLICATIONS

K. Mistry et al., "A 45nm Logic Technology with High-k+Metal Gate Transistors, Strained Silicon, 9 Cu Interconnect Layers, 193nm Dry Patterning, and 100% Pb-free Packaging," IEEE 2007, 4 pages.
(Continued)

*Primary Examiner* — Shahed Ahmed
(74) *Attorney, Agent, or Firm* — Anthony Canale; Hoffman Warnick LLC

(57) ABSTRACT

Embodiments of the disclosure provide an integrated circuit device and related methods. The disclosure may provide a transistor device, including: a gate structure; a drain extension region extending laterally from partially under the gate structure to a drain region; and a gate spacer located over the drain extension region. A silicide-blocking layer is over and in contact with the gate spacer. The silicide-blocking layer has a first end over the gate structure and a second, opposing end over the drain extension region. The structure also provides a conductive field plate, including a conductive layer over and in contact with the silicide-blocking layer. A field plate contact is formed on the conductive field plate.

20 Claims, 7 Drawing Sheets

(51) Int. Cl.
 *H01L 29/78* (2006.01)
 *H01L 29/06* (2006.01)

(56) References Cited

U.S. PATENT DOCUMENTS

| | | | |
|---|---|---|---|
| 8,790,966 | B2 | 7/2014 | Zhang et al. |
| 8,963,241 | B1 | 2/2015 | Khemka et al. |
| 9,219,147 | B2 | 12/2015 | Toh et al. |
| 9,590,053 | B2 | 3/2017 | Chou et al. |
| 9,871,132 | B1 | 1/2018 | Liu et al. |
| 9,905,687 | B1* | 2/2018 | Zhu ............... H01L 29/42368 |
| 9,954,097 | B2 | 4/2018 | Chou et al. |
| 10,636,904 | B2 | 4/2020 | Chou et al. |
| 11,158,737 | B2* | 10/2021 | Jin ............... H01L 29/7816 |
| 2019/0027585 | A1* | 1/2019 | Wei ............... H01L 29/66659 |
| 2019/0221666 | A1* | 7/2019 | Bang ............... H01L 29/7835 |
| 2019/0334032 | A1* | 10/2019 | Ho ............... H01L 23/49562 |
| 2019/0363186 | A1 | 11/2019 | You et al. |
| 2020/0013888 | A1* | 1/2020 | Su ............... H01L 29/7816 |
| 2020/0126990 | A1 | 4/2020 | Zhang |
| 2021/0036112 | A1* | 2/2021 | Xu ............... H01L 29/42368 |
| 2021/0234042 | A1 | 7/2021 | Xu |

OTHER PUBLICATIONS

U S. Patent Application titled: "Integrated Circuit Structure with Metal Gate and Metal Field Plate Having Coplanar Upper Surfaces," filed Mar. 19, 2021, 31 pages.

U.S. Patent Application titled: "Transistor Structure with Gate Over Well Boundary and Related Methods to Form Same," filed Jan. 6, 2022, 48 pages.

U.S. Appl. No. 17/206,195, Office Action dated Mar. 29, 2022, 19 pages.

* cited by examiner

STRUCTURE AND METHOD TO PROVIDE CONDUCTIVE FIELD PLATE OVER GATE STRUCTURE

BACKGROUND

The present disclosure relates generally to methods for transistor fabrication, and more specifically, to a structure of, and method to provide, a conductive field plate over a gate structure.

Advanced manufacturing of integrated circuits (ICs) requires formation of individual circuit elements, e.g., transistors such as field-effect-transistors (FETs) and the like, based upon specific circuit designs. A FET generally includes source, drain, and gate regions. The gate region is placed between the source region and the drain region and controls the current through a channel region between the source and drain regions. Gates may be composed of various metals and often include a work function metal, which is chosen to create desired characteristics of the FET. Gates may also include various dielectric layers. Transistors may be formed over a semiconductor body and may be electrically isolated with an insulating dielectric layer, e.g., inter-level dielectric layer. Contacts may be formed to each of the source, drain, body, and/or gate regions through the dielectric layer in order to electrically connect the transistors to other circuit elements that may be formed subsequent to the transistor in other metal levels.

A central goal of IC manufacturing is to minimize device dimensions, thereby including more devices per chip as well as increasing chip reliability and performance. However, reducing dimensions may lead to undesirable outcomes. In advanced node FinFET devices, for instance, the proximity of gate contacts to other conductors may lead to unwanted parasitic capacitance or conduction, i.e., leakage, between these adjacent structures, particularly at the respective top and bottom portions of the structures. This situation can adversely affect device performance or yield. In another example, as device dimensions decrease and the electric field in the channel region increases, high-energy particles travelling through the channel region, known as "hot carriers," may be injected into and cause damage to structures within the device, such as gate dielectric layers. In yet another example, as device dimensions decrease, the dimensions of protective layers also decrease. Decreasing the dimensions of protective layers increases, for example, the likelihood of unwanted short circuits between adjacent conductive elements.

There is also a need for high voltage semiconductor devices for handing high voltage ("HV") input/output ("I/O") signals, but voltage requirements do not necessarily scale with the technology. Typically, HV devices have either symmetrical or asymmetrical structure. Symmetrical devices may have a thick gate dielectric; drain and source side extensions; drain and source side isolation oxide; or a combination thereof. Asymmetric devices typically have a thick a gate dielectric on the drain side, use an isolation oxide on the drain side or drift region on the drain region, or a combination thereof.

SUMMARY

Aspects of the disclosure are directed to a structure of an IC device, the structure including: a transistor that includes a gate structure, a drain extension region extending laterally from partially under the gate structure to a drain region, and a gate spacer located over the drain extension region; a silicide-blocking layer over and contacting the gate spacer, the silicide-blocking layer having a first end over the gate structure and a second, opposing end over the drain extension region; a conductive field plate that includes a conductive layer over and in contact with the silicide-blocking layer; and a field plate contact on the conductive field plate.

Further aspects of the disclosure are related to a conductive field plate, including: a silicide-blocking layer over and contacting a gate spacer of an IC device; a conductive region over and contacting the silicide-blocking layer; a field plate contact on the conductive layer; and a conductive region over the conductive layer, wherein the field plate contact electrically couples the conductive layer to the conductive region, and wherein a source contact electrically couples the conductive region to source region of the IC device.

Additional aspects of the disclosure include a method of forming an IC device, the method including: forming a transistor device, including a gate structure, a drain extension region extending laterally from partially under the gate structure to a drain region, and a gate spacer located over the drain extension region; forming a silicide-blocking layer over and in contact with the gate spacer, the silicide-blocking layer having a first end over the gate structure and a second, opposing end over the drain extension region; forming a conductive field plate on and in contact with the silicide-blocking layer; and forming a field plate contact to the conductive field plate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
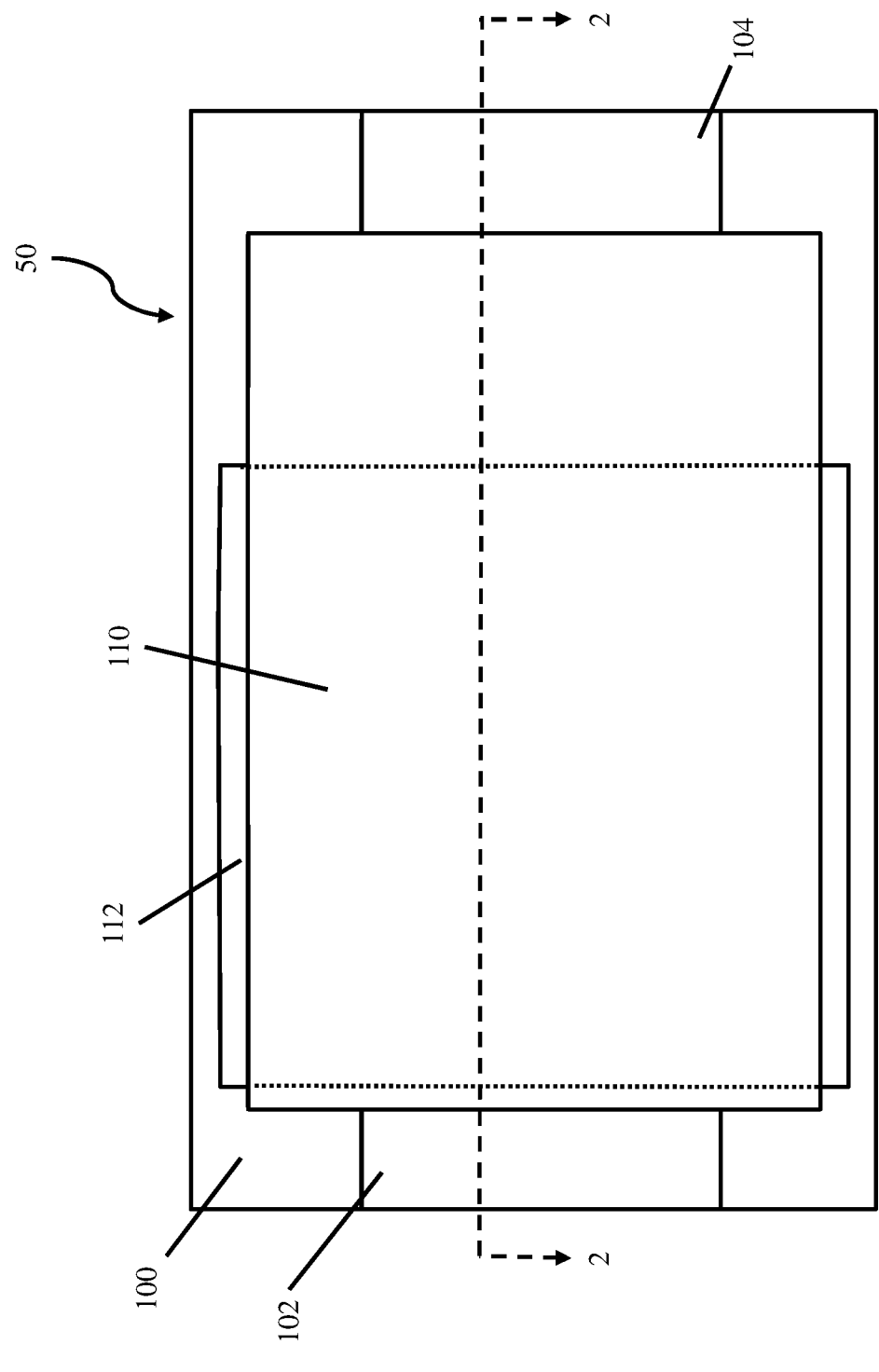
FIG. 1 shows a top-down view of a circuit design layout of a preliminary structure, including standard transistor components.

It is noted that the drawings of the disclosure are not necessarily to scale. The drawings are intended to depict only typical aspects of the disclosure, and therefore, should not be considered as limiting the scope of the disclosure. In the drawings, like numbering represents like elements between the drawings.

DETAILED DESCRIPTION

The following description, reference is made to the accompanying drawings that form a part thereof, and in which is shown by way of illustration specific illustrative embodiments in which the present teachings may be practiced. These embodiments are described in sufficient detail to enable those skilled in the art to practice the present disclosure, and it is to be understood that other embodiments may be used and that changes may be made without departing from the scope of the present disclosure. The following description is, therefore, merely illustrative.

It will be understood that when an element such as a layer, region, body, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Aspects of the present disclosure and certain features, advantages, and details thereof, are explained more fully below with reference to the embodiments illustrated in the accompanying drawings. Descriptions of well-known materials, fabrication tools, processing techniques, etc., are omitted so as not to unnecessarily obscure the disclosure in details. It should be understood, however, that the detailed descriptions and the specific examples, while indicating embodiments of the disclosure, are given by way of illustration only, and not by way of limitation. Various substitutions, modifications, addition and/or arrangements within the spirit and/or scope of the underlying inventive concepts will be apparent to those skilled in the art from this disclosure.

Several issues may arise during the transistor device fabrication process. For example, a contact may penetrate through the gate spacer and to the gate, wherein the resulting short may negatively affect performance or even destroy the device. By adding a conductive field plate over portions of the gate structure and/or gate spacer, gate shorting between the conductive field plate contact and portions of the gate structure is avoided and device performance and reliability is improved.

Embodiments of the disclosure provide IC devices and related methods. An IC device may include various transistor components, such as a gate structure, gate spacers, source/drain regions, gate conductors, gate dielectrics, and so on. The transistor structure may include a semiconductor body and a gate structure extending over the semiconductor body. Gate spacers may abut the gate structure on one or more sides. A drain extension region is below the gate and within the substrate. Contacts may be on one or more components. The transistor structure may be either symmetrical or asymmetrical n-type or p-type devices. N-type transistor structures may include n-type drift regions or wells with a p-type body, whereas p-type transistor structures may include p-type drift regions or wells with an n-type body.

Embodiments of the present disclosure also provide a method to form an IC device with a conductive field plate over a portion of a gate structure, and forming a field plate contact on the conductive field plate without the contact penetrating lower layers (e.g., the gate spacer). The method may include forming one or more n-type or p-type doped regions during the substrate formation, gate dielectric formation, gate formation, spacer formation, and contact formation. Additionally, the method may also include forming a silicide-blocking layer, forming a conductive layer over the silicide-blocking layer, and forming a silicide. Silicides may be formed using, for example, thermal annealing processes.

Figure 2:
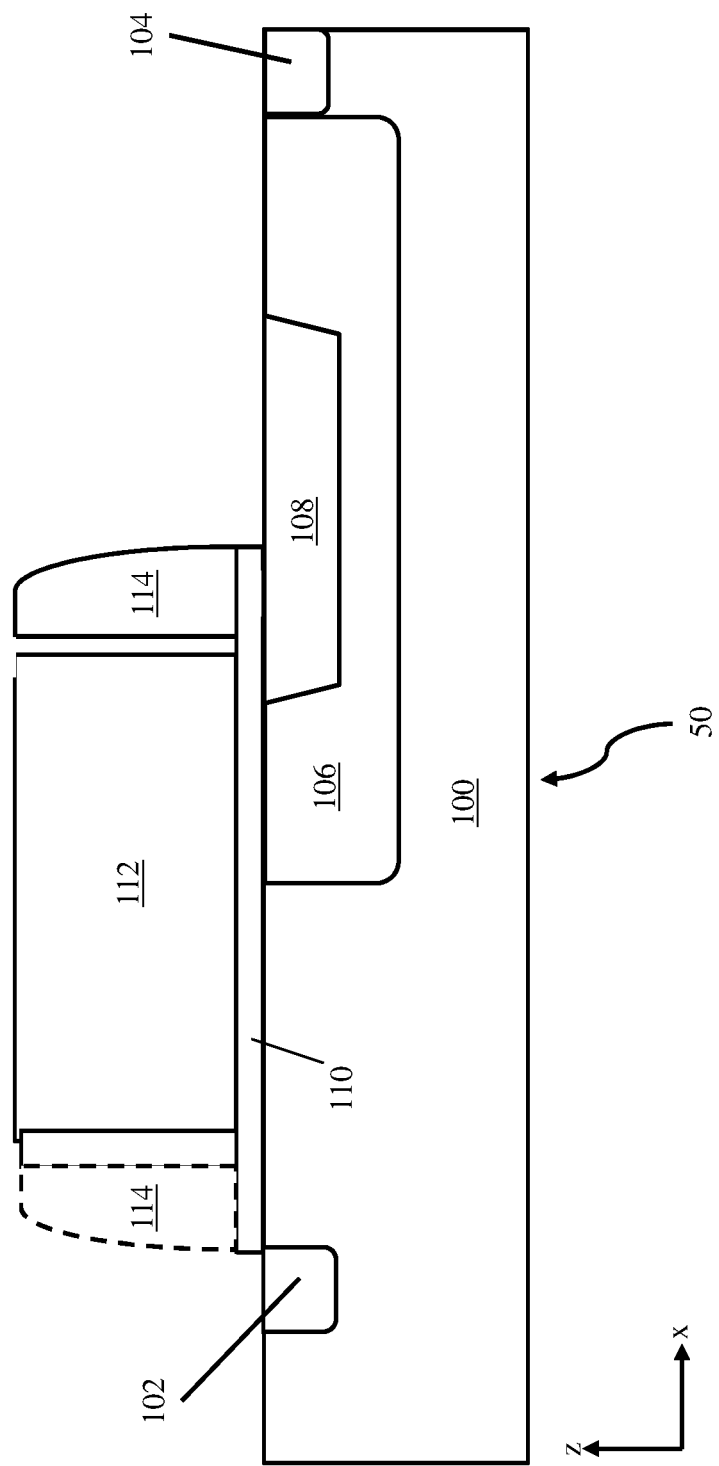
FIG. 2 shows a cross-sectional view of a preliminary structure taken along line 2-2, processed to have various standard transistor components.

Referring now to FIGS. 1 and 2, a preliminary structure 50 upon which embodiments of the disclosure will be applied, is depicted. FIG. 1 shows a top-down view and FIG. 2 shows a cross-sectional view taken along line 2-2 in FIG. 1. Preliminary structure 50 includes a substrate 100 as the foundation on which the structure is made. Substrate 100 may include, in one embodiment, a bulk semiconductor material such as a bulk silicon wafer or a composite substrate such as a semiconductor-on-insulator (SOI) substrate, and may include any suitable semiconductor material as known to those skilled in the art. Substrate 100 may include silicon, germanium, silicon germanium, silicon carbide, diamond, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Substrate 100 may include, in one embodiment, a bulk semiconductor material such as a bulk silicon wafer or a composite substrate such as a semiconductor-on-insulator (SOI) substrate, and may include any suitable semiconductor material as known to those skilled in the art.

Still referring to FIGS. 1 and 2, source region 102 and drain region 104 may be formed within substrate 100 by any known or later developed methods and materials. Source region 102 and drain region 104 may be either n-type or p-type doped. As used herein, doping is the process of introducing impurities (dopants) into the semiconductor substrate, or elements formed on the semiconductor substrate, and is often performed with a mask (or previously-formed, elements in place) so that only certain areas of substrate 100 will be doped. For example, doping is used to form source region 102 and drain region 104 of preliminary structure 50. An ion implanter, for example, is typically employed for the actual implantation. p-type doping in semiconductor substrate is where the concentration of "holes" is higher than the concentration of electrons. Examples of p-type doping include silicon doped (enhanced) with boron (B), Indium (In), and the like. n-type doping is to generate free electrons (by "donating" electron to semiconductor). Common donors in silicon (Si): phosphorous (P), arsenic (As), antimony (Sb) and in gallium arsenic (GaAs): sulphur (S), selenium (Se), tin (Sn), silicon (Si), and carbon (C). In one non-limiting example, source region 102 may be seated in a doped body region, and a conductive contact may be formed.

Still referring to FIGS. 1-2, within substrate 100 and in between source region 102 and drain region 104 is drain extension region 106. Drain extension region 106 may protect preliminary structure 50 from degradation over its lifetime. Drain extension region 106 may be formed using the same methods and materials as source region 102 and drain region 104, as describe in more detail previously.

Still referring to FIGS. 1 and 2, isolation region 108 may be formed within drain extension region 106. Isolation region 108 may serve to decrease charge carrier mobility, and thereby reduce linear drain current, between source region 102 and drain region 104 by lengthening the current flow path. Isolation region 108 may include, for example, a trench isolation such as a shallow trench isolation (STI). Isolation region 108 may be formed by etching a trench into the substrate and filling the trench with an insulating material to isolate one region of the substrate from, for example, an adjacent region of the substrate. One or more transistors of a given polarity may be disposed within an area isolated by isolation region 108. Each isolation region 108 may be formed of any currently-known or later developed substance for providing electrical insulation, and as examples may include, but are not limited to, high-k or low-k dielectric materials, silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or combinations thereof. In some embodiments, isolation layer 108 may or may not be present.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Still referring to FIGS. 1 and 2, gate dielectric layer 110 may be formed over of substrate 100. Gate dielectric layer 110 may physically protect and electrically isolate underlying components. Gate dielectric layer 110 may be formed using any known or later developed processes, such as, but not limited to: Local Oxidation of Silicon (LOCOS) processing, thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition. It will be appreciated by those skilled in the art that gate dielectric layer 110 may include one or more dielectric materials. Additionally, those skilled in the art will appreciate that different gate dielectric materials may differ in dielectric constant, k. Gate dielectric layer 110 may include a high-k dielectric, such as, but not limited to: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 110 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) $[(CH_3)_2SiO]_4$ 2.7 available from Air Liquide, etc., or other low dielectric constant (k<3.9) material, or combinations thereof. Gate dielectric layer 110 may also include high-k dielectric materials, such as, but not limited to, hafnium silicate (HfSiO), zirconium silicate (ZrSiO$_x$), silicon oxynitride (SiON), or any combination of these materials.

As used herein, "depositing" and "deposition" may include any now known or later developed techniques appropriate for the material to be deposited including but are not limited to, for example: chemical vapor deposition (CVD), low-pressure CVD (LPCVD), plasma-enhanced CVD (PECVD), sub-atmospheric CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Still referring to FIGS. 1 and 2, gate structure 112 may be formed over gate dielectric layer 110 and in between source region 102 and drain region 104, and may serve to apply a voltage to the device, thereby putting it an operational state, e.g., allowing charge carriers to flow from source to drain. Gate structure 112 may be formed using any known or later developed fabrication processes, such as, but not limited to, the processes for forming gate dielectric layer 110, as described in detail previously. It will be appreciated by those skilled in the art that gate structure 112 may include one or more layers, potentially forming a gate stack. Gate structure 112 may be formed using any known or later developed conductive material such as, but not limited to, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or polysilicon (poly-Si) (doped or undoped) or combinations thereof. Gate structure 112 may also include high-k dielectric materials such as, but not limited to, metal oxides such as tantalum oxide (Ta$_2$O$_5$), barium titanium oxide (BaTiO$_3$), hafnium oxide (HfO$_2$), zirconium oxide (ZrO$_2$), aluminum oxide (Al$_2$O$_3$) or metal silicates such as hafnium silicate oxide (HfA1SiA2OA3) or hafnium silicate oxynitride (HfA1SiA2OA3NA4), where A1, A2, A3, and A4 represent relative proportions, each greater than or equal to zero and A1+A2+A3+A4 (1 being the total relative mole quantity).

Still referring to FIGS. 1 and 2, gate spacer 114 may be formed abutting gate structure 112, serving to physically protect portions of gate structure 112 as well as components underneath gate spacer 114. Gate spacer 114 may be formed by any currently known or later developed methods and materials, such as, but not limited to, those described previously for gate dielectric layer 110. In one non-limiting example, gate spacer 114 may initially be formed on both sides of gate structure 112, with the source-side portion of gate spacer 114 (depicted with a dotted line) being partially or completely removed in subsequent processing, while the drain-side portion of gate spacer 114 is preserved, as illustrated in subsequent figures. In another non-limiting example, the source-side portion of gate spacer 114 may still be present after subsequent processing and may be thinner than the drain-side portion of gate spacer 114 (FIG. 3).

Figure 3:
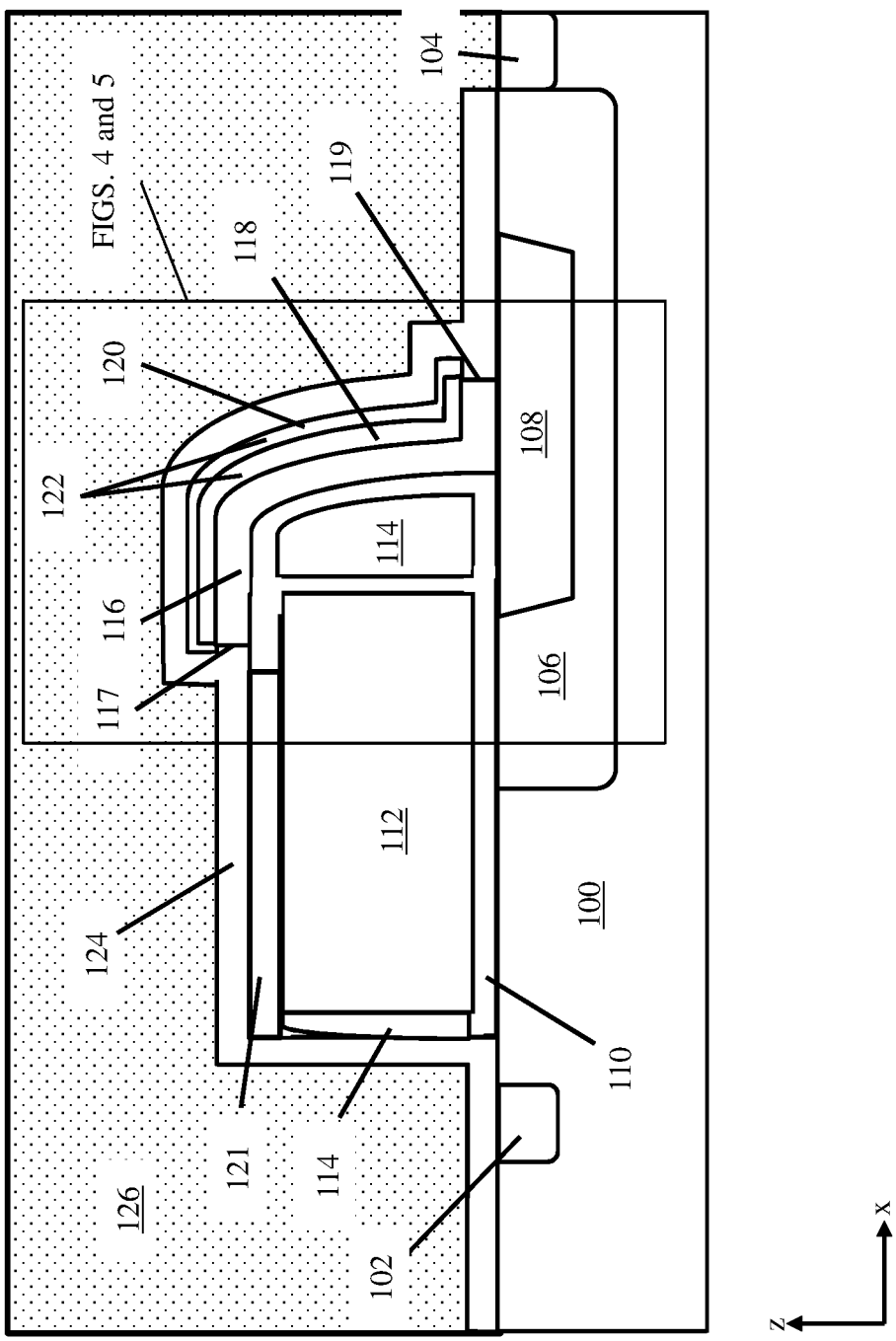
FIG. 3 shows a cross-sectional view of a device with a conductive field plate formed over top of a preliminary structure, thereby forming an illustrative device according to embodiments of the disclosure.
Figure 4:
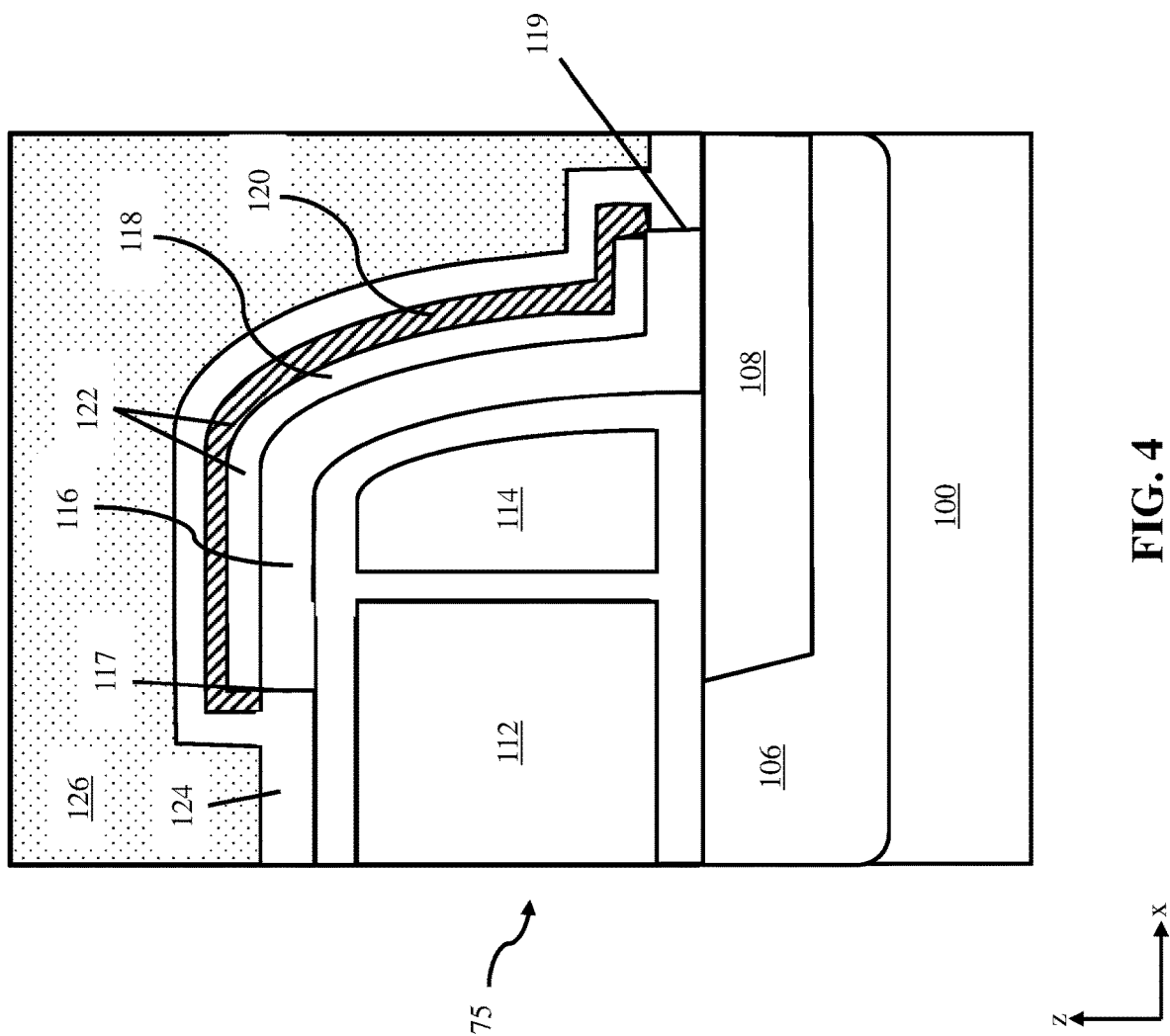
FIG. 4 shows an enlarged cross-sectional view of a portion of the device of FIG. 3 to show a conductive field plate including two separate layers, according to embodiments of the disclosure.

Referring now to FIGS. 3-4, a cross-sectional view of formation of a conductive layer 118 (discussed in more detail below) over gate spacer 114 according to embodiments of the disclosure, is illustrated. Silicide-blocking layer 116 may be formed over preliminary structure 50 as a barrier to protect underlying components during subsequent silicide formation. Silicide-blocking layer 116 may be formed over gate spacer 114 as to protect from removal during subsequent processing. Silicide-blocking layer 116 may be formed by any known or later developed methods, such as, but not limited to, deposition or epitaxial growth. Silicide-blocking layer 116 may then be selectively patterned to have a first end 117 over gate structure 112 and a second end 119 in the opposite direction, terminating over drain extension region 106 and isolation region 108. Silicide-blocking layer 116 may be patterned using any known or later developed methods, including, but not limited to, patterning silicide-blocking layer 116 lithographically with a mask and then etching the undesired portions. Silicide-blocking layer 116 may be selectively etched to cover and protect certain underlying components during subsequent silicide formation. Silicide-blocking layer may include any known or later developed silicide-blocking materials, including, but not limited to: oxides (e.g., silicon oxide), nitrides (e.g., silicon nitride), the same material or materials as gate spacer 114, or any combination thereof.

In lithography (or "photolithography"), a radiation sensitive "resist" coating is generally formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Referring now to FIGS. 3-4, conductive layer 118 may serve as a conductive region on which a conductive contact 128 (FIG. 7) may be formed. A voltage may be applied to conductive layer 118, which creates an electric field within drain extension region 106 and/or gate dielectric 110 at drain edge, thereby increasing device performance while reducing undesirable effects, such as, but not limited to, hot carrier injection into gate dielectric layer 110. Conductive layer 118 may be formed over and in contact with silicide-blocking layer 116, and then may be selectively patterned using methods such as, but not limited to, photolithography or etching. Conductive layer 118 may be formed by any known or later developed processes, including, but not limited to, deposition or epitaxial growth as discussed in more detail previously. Conductive layer 118 may include, but is not limited to, doped and/or undoped polysilicon, silicide, amorphous silicon, any conductive material, any material that can be silicided, any metal layer, and any combination thereof. In some embodiments, conductive layer 118 may include polysilicon or silicide. In a non-limiting example, formation of conductive layer 118 with doped or undoped polysilicon may include or be followed by an annealing step.

Referring still to FIGS. 3-4, a silicide layer 120 may be formed over conductive layer 118, serving as part of conductive layer on which a conductive contact may be formed. That is, silicide layer 120 is a conductive layer on which a conductive contact 128 (FIG. 7) may be formed. A voltage may be applied to silicide layer 120, which creates an electric field within drain extension region 108 and/or gate dielectric 110 at drain edge, thereby increasing device performance while reducing undesirable effects, such as, but not limited to, hot carrier injection into gate dielectric layer 110. Silicide layer 120 may be formed using any now known or later developed technique, e.g., performing an in-situ pre-clean, depositing a metal such as titanium (Ti), nickel (Ni), and/or cobalt (Co), etc., annealing to have the metal react with silicon, and removing unreacted metal. Silicide layer 120 may be a self-aligned silicide (salicide), which is formed without photolithography patterning processes, and may include polycide processing. Because silicide layer 120 may be formed using the material in conductive layer 118 (e.g., polycide growth on polysilicon in conductive layer 118), it may not necessarily require subsequent patterning. In a non-limiting example, an additional silicide layer 121 may be formed over gate structure 112 and concurrently with silicide layer 120.

Figure 5:
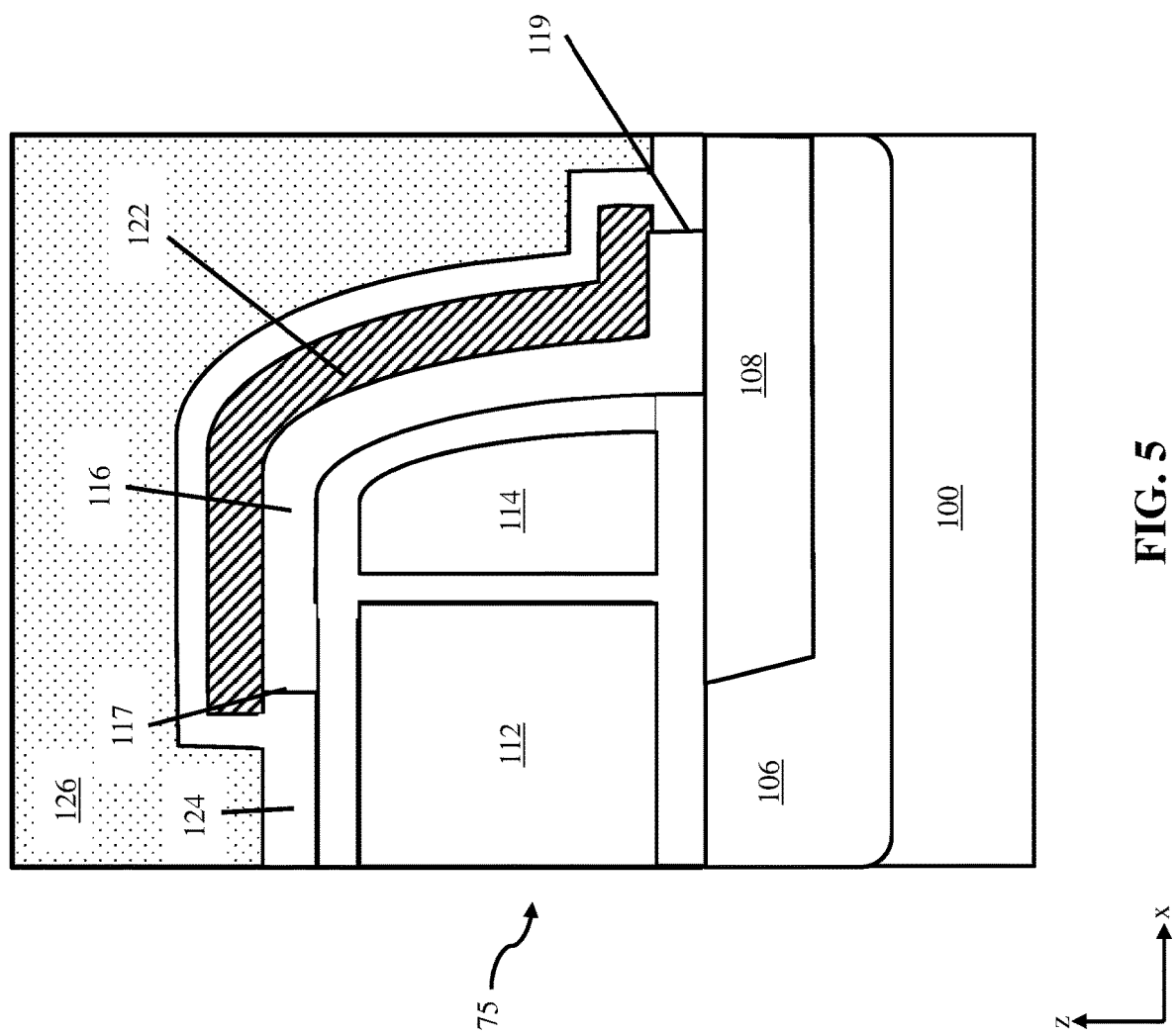
FIG. 5 shows an enlarged cross-sectional view of a portion of the device of FIG. 3 with a conductive field plate formed of one material, according to other embodiments of the disclosure.

Conductive layer 118 and silicide layer 120 may combine to create a conductive field plate 122. Conductive field plate 122 may be formed over silicide-blocking layer 116, and partially over gate structure 112 and drain extension region 106, thereby protecting underlying components and layers from being damaged during subsequent manufacturing of overlying components. Conductive field plate 122, may serve as both a physical barrier and as a conductive region within a device 75. Additionally, conductive field plate 122 may include at least one conductive material, and may therefore act as a conductive region to apply an electric field within drain extension region 108. Since conductive field plate 122 may include conductive layer 118 and silicide layer 120, it will necessarily be formed by the same methods and processes as described previously for conductive layer 118 and silicide layer 120. In an embodiment, conductive field plate 122 may be at most approximately 200 Angstroms in thickness, although other dimensions are contemplated. In some embodiments, conductive field plate 122 may include polysilicon, silicide, or both polysilicon and silicide. FIG. 5 depicts a fully silicided conductive field plate 122.

FIG. 5 shows a cross-sectional view in which conductive field plate 122 includes a single conductive layer. A fully-silicided conductive field plate may be formed as a single layer by using any currently known or later developed process to form a conductive layer, e.g., one or more methods and/or materials described herein regarding silicide layer 120. In one non-limiting example, a fully-silicided conductive field plate may be formed by completely processing polysilicon in conductive layer 118 into silicide using, for example, polycide processes. In some non-limiting examples, conductive field plate 122 may be connected to any nearby electrically grounded conductive region.

As shown in FIGS. 3-5, an insulating layer 124 may be formed over gate structure 112 and conductive field plate 122, and may electrically and/or physically isolate conductive field plate 122 from other conductive components in device 75. Insulating layer 124 may be formed using the same methods and materials as gate dielectric layer 110, as discussed in detail previously.

FIGS. 3-5 also show a cross-sectional view of forming an inter-layer dielectric (ILD) layer 126 over device 75 to separate device 75 from overlying components, such as, but not limited to, conductive layers above. ILD layer 126 may be formed using the same methods and materials as gate dielectric layer 110, as discussed in detail previously. In one non-limiting example, ILD layer 126 may include an air gap (also known as an "air void") to form an effective low dielectric constant material, which may help to improve the operational speed of the semiconductor device.

Figure 6:
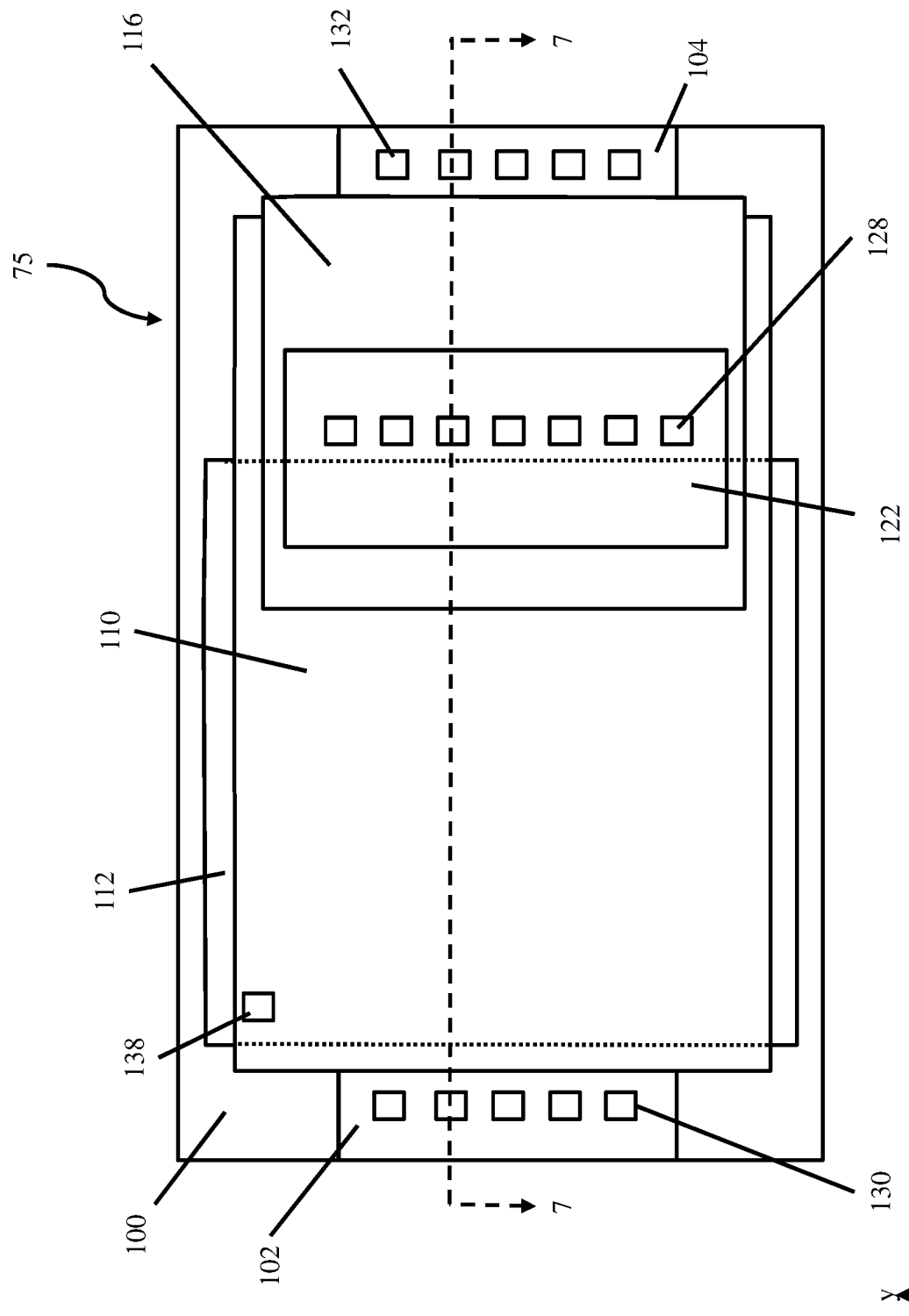
FIG. 6 shows a top-down view of a circuit design layout of an illustrative device with a conductive field plate over a gate structure, according to embodiments of the disclosure.
Figure 7:
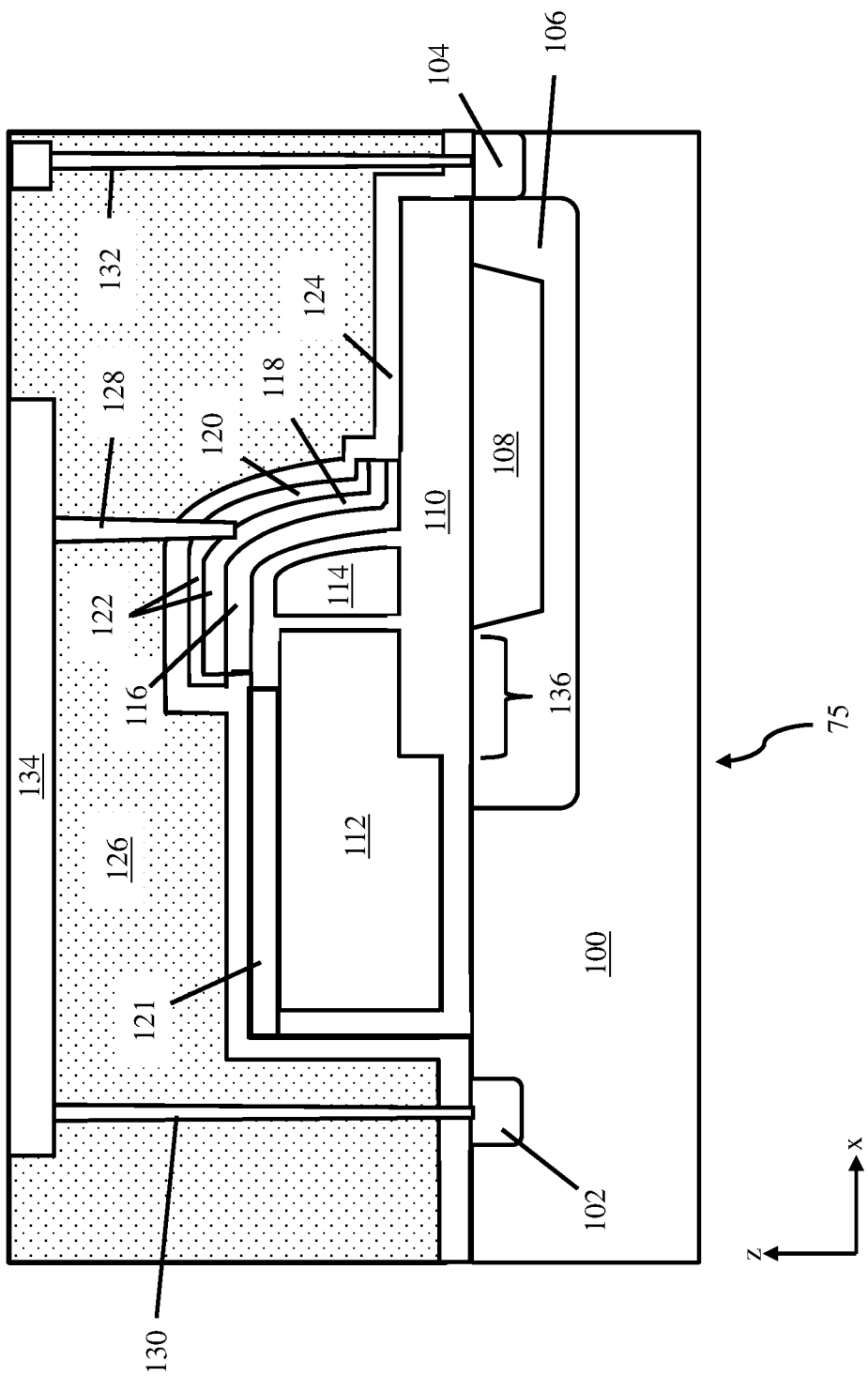
FIG. 7 shows a cross-sectional view of the device taken along line 7-7 in FIG. 6, with a conductive region electrically coupled to a conductive field plate, according to embodiments of the disclosure.

Referring to FIGS. 6 and 7, FIG. 6 shows a top-down view of a circuit design layout of device 75 with conductive field plate 122 over gate structure 112, and FIG. 7 shows a cross-sectional view of device 75 taken along line 7-7 in FIG. 6. As illustrated, a field plate contact 128 may be formed on conductive field plate 122 and may electrically couple conductive field plate 122 to conductive layers above device 75. As noted, conductive field plate 122 prevents field plate contact 128 from penetrating gate spacer 114 and shorting gate structure 112. Field plate contact 128 may be formed by any known or later developed conductive layer forming processes, including, but not limited to, damascene processing or by patterning a mask, etching contact openings to the respective gate structures, and forming a conductor in the openings. Field plate contact 128 may include known or later developed conductors, including, but not limited to, copper (Cu), titanium (Ti), cobalt (Co), and/or tungsten (W). To minimize the parasitic capacitance between source region 102 and gate structure 112 (due to proximity of the gate structure 112 and conductive region 134), conductive region 134 need not necessarily be over gate structure 112. In one non-limiting example, conductive region 134 may be configured such as to minimize overlap with gate structure 112, while field plate contact 128 can be connected to source region 102 via conductive region 134. In another non-limiting example, conductive region 134 may not directly overlay gate structure 112, as to reduce parasitic capacitance. In yet another non-limiting examples, field plate contact 128 may be a single contact or multiple contacts. In other non-limiting examples, each field plate contact 128 may be formed having any conceivable geometry, such as, but not limited to, cuboidal, cylindrical, rectangular prismatic, etc., or combinations thereof.

Still referring to FIGS. 6 and 7, a source contact 130 may be formed over and contacting source region 102. Source contact 130 may electrically couple source region 102 to other components and to conductive layers above device 75. Source contact 130 may be formed using the same methods and materials as field plate contact 128, as described in more detail previously. Similarly, a drain contact 132 may be formed over and contacting drain region 104. Drain contact 132 may be electrically couple drain region 104 to conductive layers above device 75. Drain contact 132 may be formed using the same methods and materials as field plate contact 128, as described in more detail previously. An illustrative conductive region 134 is shown over conductive field plate 122 Conductive region 134 may be formed using the same methods and materials as field plate contact 128, as described in more detail previously. Field plate contact 128 may electrically couple conductive field plate 122 to conductive region 134. In one non-limiting example, source contact 130 may extend from source region 102 to conductive region 134, thereby electrically coupling source region 102 to conductive field plate 122. In another non-limiting example, source region 102 may be electrically coupled to conductive field plate 122 through conductive region 134. In some embodiments, field plate contact may or may not be within an active region of the device and still be connected to conductive field plate 122.

Gate contact 138 is shown in the top down perspective of FIG. 6 to illustrate that gate contact 134 and field plate contact 128 are distinct and not necessarily electrically coupled. Gate contact 138 may or may not be within an active region of the device and still be connected to gate structure 112. In one non-limiting example, gate contact 138 may be formed having any conceivable geometry, such as, but not limited to, cuboidal, cylindrical, rectangular prismatic, etc., or combinations thereof.

Device 75 may include substrate 100 on the bottom, serving as a base for device 75. Gate structure 112 is over substrate 100 and in between source region 102 and drain region 104. Voltage may be applied to gate structure 112, putting the device into an "on" state, e.g., allowing charge carriers to flow from source region 102 to drain region 104. Gate spacer 114 abuts a sidewall of gate structure 112 and act as a physical barrier between gate structure 112 and other device components. Gate dielectric layer 110 may be under (and/or around) gate structure 112 and/or gate spacer 114. Gate dielectric layer 110 may serve to electrically isolate and/or physically protect gate structure 112 or gate spacer 114. Silicide-blocking layer 116 is over gate spacer 114 and protects underlying components during subsequent silicide formation processes. Conductive field plate 122 is over silicide-blocking layer 116 and may form a physical barrier between underlying components and overlying components. As shown in FIGS. 3, 4 and 7, conductive field plate 122 may include two layers: conductive layer 118 and silicide layer 120. Alternatively, as shown in FIG. 5, conductive field plate 122 may include a single conductive material. In some embodiments, conductive field plate 122 may include polysilicon, silicide, or both polysilicon and silicide. Field plate contact 128 may be on conductive field plate 122 and electrically couple conductive field plate 122 to other components within device 75, such as, but not limited to, conductive region 134.

In some embodiments, as shown in FIG. 7, a portion 136 of gate structure 112 over drain extension region 106 serves to improve device performance and may be at most approximately 0.5 micrometers. Here, gate dielectric layer 110 may have different thicknesses under gate structure 112. Data collected via TCAD simulation, comparing a FET device with conductive field plate 122 to a FET device without conductive field plate 122, demonstrates device performance improvement by, for example, improving hot carrier reliability. Additionally, portion 136 of gate structure 112 may improve device performance by, for example, increasing breakdown voltage by approximately 23%; decreasing on resistance by approximately 10 to 15%; and reducing gate-to-drain capacitance by approximately 20 to 30%. As used herein, "on resistance" refers to the resistance to charge carrier mobility in the area between source region 102 and drain 104 and is measured in linear bias condition for the device. As used herein, "gate-to-drain capacitance" refers to undesired capacitance created by the close proximity of gate structure 112 to drain structure 104 which slows down device performance.

Referring still to FIGS. 6 and 7, device 75 includes silicide-blocking layer 116 over and contacting gate spacer 114 to protect underlying components from subsequent silicide processing. Conductive layer 118 is over and contacting silicide-blocking layer 116, and acts as a physical barrier as well as a conductive material to which a voltage can be applied to. Field plate contact 128 is on conductive layer 118 and electrically couples conductive region 134 to conductive layer 118. Source contact 130 is on source region 102 and electrically couples conductive region 134 to source region 102. In some embodiments, conductive layer 118 includes polysilicon or silicide. In other embodiments, the thickness of conductive layer 118 and silicide layer 120 combined is at most approximately 200 angstroms, although other dimensions are contemplated.

Aspects of the present disclosure are shown and described with respect to a planar FET configuration. It is to be understood, however, that aspects of the present disclosure are applicable to gate first planar CMOS transistor technologies with any channel material and formed on any substrate.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit device, comprising:
   a transistor device, including:
      a gate structure;
      a drain extension region extending laterally from partially under the gate structure to a drain region; and
      a gate spacer located over the drain extension region;
   a silicide-blocking layer over and contacting the gate spacer, the silicide-blocking layer having a first end over the gate structure and a second, opposing end over the drain extension region;
   a conductive field plate, including a conductive layer over and in contact with the silicide-blocking layer; and
   an isolation region within the drain extension region, wherein the isolation region extends from beneath the gate structure to beneath the conductive field plate; and
   a field plate contact on the conductive field plate.

2. The integrated circuit device of claim 1, wherein the conductive layer includes silicon.

3. The integrated circuit device of claim 1, wherein the conductive layer includes silicide.

4. The integrated circuit device of claim 1, wherein the conductive layer includes metal.

5. The integrated circuit device of claim 1, further comprising:
   a conductive region on the field plate contact; and
   a source contact extending from the conductive region to a source region of the transistor device.

6. The integrated circuit device of claim 1, wherein a portion of the gate structure is over the drain extension region, and wherein the portion is at most approximately 0.5 micrometers in horizontal length.

7. The integrated circuit device of claim 1, wherein the silicide-blocking layer includes a dielectric.

8. The integrated circuit device of claim 1, further comprising a gate dielectric layer under the gate structure and over the drain extension region.

9. The integrated circuit device of claim 8, wherein the gate dielectric layer is thicker over the drain extension region.

10. The integrated circuit device of claim 8, wherein the silicide-blocking layer is over and contacting the gate dielectric layer.

11. A conductive field plate, comprising:
    a silicide-blocking layer over and contacting a gate spacer of a transistor device, the silicide-blocking layer over an isolation region within a drain extension region of the transistor device, wherein the isolation region extends from beneath a gate structure of the transistor device to beneath the conductive field plate;
    a conductive layer over and contacting the silicide-blocking layer;
    a field plate contact on the conductive layer; and
    a conductive region over the conductive layer, wherein the field plate contact electrically couples the conductive region to the conductive layer, and wherein a source contact electrically couples the conductive region to a source region of the transistor device.

12. The conductive field plate of claim 11, wherein the conductive layer includes silicide.

13. The conductive field plate of claim 11, wherein the conductive layer includes silicon.

14. The conductive field plate of claim 11, wherein the conductive layer includes metal.

15. The conductive field plate of claim 11, wherein the silicide-blocking layer includes a first end over a gate structure of the transistor device and a second, opposing end over a drain extension region of the transistor device.

16. A method of forming an integrated circuit device, comprising:
    forming a transistor device, including:
       a gate structure;
       a drain extension region extending laterally from partially under the gate structure to a drain region; and
       a gate spacer located over the drain extension region;
    forming a silicide-blocking layer over and in contact with the gate spacer, the silicide-blocking layer having a first end over the gate structure and a second, opposing end over the drain extension region;
    forming a conductive field plate on and in contact with the silicide-blocking layer;
    forming an isolation region within the drain extension region, wherein the isolation region extends from beneath the gate structure to beneath the conductive field plate; and
    forming a field plate contact to the conductive field plate.

17. The method of claim 16, wherein the conductive field plate includes a conductive layer and a silicide layer.

18. The method of claim 17, wherein the conductive layer includes silicide.

19. The method of claim 16, further comprising:
    forming a gate dielectric layer under the gate structure and over the drain extension region.

20. The method of claim 19, wherein the gate dielectric layer is thicker over the drain extension region.

* * * * *